(12) United States Patent
Song

(10) Patent No.: US 7,183,851 B2
(45) Date of Patent: Feb. 27, 2007

(54) DIFFERENTIAL DUAL PORT CURRENT CONVEYOR CIRCUIT

(75) Inventor: Hongjiang Song, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 5 days.

(21) Appl. No.: 10/883,358

(22) Filed: Jun. 30, 2004

(65) Prior Publication Data

US 2006/0001490 A1    Jan. 5, 2006

(51) Int. Cl.
*H03F 3/45*    (2006.01)
(52) U.S. Cl. .................. 330/257; 330/252; 330/302
(58) Field of Classification Search ................ 330/257, 330/252, 302
See application file for complete search history.

(56) References Cited

U.S. PATENT DOCUMENTS

| | | | | |
|---|---|---|---|---|
| 5,198,781 A | * | 3/1993 | Kusakabe | .................... 330/257 |
| 5,337,007 A | * | 8/1994 | Barrett et al. | ................ 330/253 |
| 5,931,898 A | * | 8/1999 | Khoury | ...................... 708/819 |
| 5,959,871 A | * | 9/1999 | Pierzchala et al. | ............. 703/4 |
| 6,456,144 B2 | * | 9/2002 | Catala | ......................... 327/359 |
| 6,759,905 B2 | * | 7/2004 | Tomasini et al. | ........... 330/258 |

* cited by examiner

*Primary Examiner*—Patricia Nguyen
(74) *Attorney, Agent, or Firm*—Kacvinsky LLC

(57) ABSTRACT

A method and apparatus to provide a reconfigurable differential dual port current conveyor circuit are described.

22 Claims, 5 Drawing Sheets

US 7,183,851 B2

DIFFERENTIAL DUAL PORT CURRENT CONVEYOR CIRCUIT

BACKGROUND

Current conveyor circuits are employed in various types of integrated systems as building blocks for system designers. These circuit blocks are modular and may be used for various types of applications including high speed optical systems, as well as wireless communication systems. By utilizing modular circuit blocks, designers are able to provide better design efficiency and increase productivity while reducing development costs. A first generation current conveyor may employ a reference terminal which supports a current equal to the current conveyed between the input and output terminals of the circuit. In a second generation current conveyor circuit, the reference port has a high impedance value which is arranged to control the potential at a second port while supporting a small or ideally zero current.

DETAILED DESCRIPTION

Figure 1:
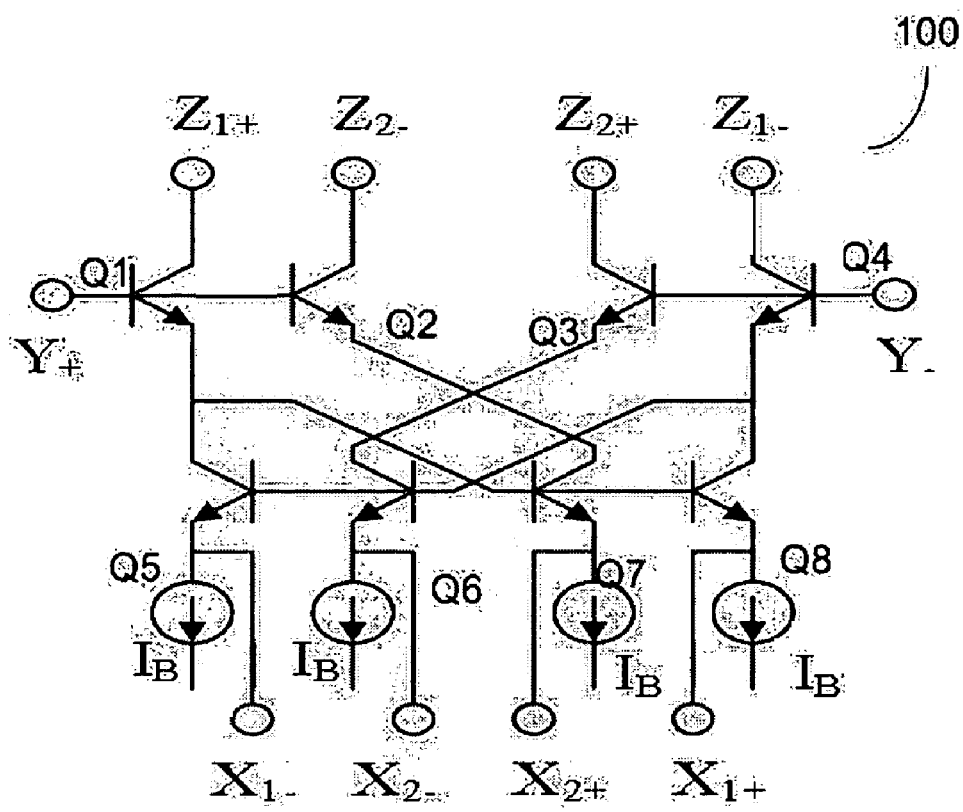
FIG. 1 illustrates a schematic diagram of a dual port current conveyor in accordance with one embodiment.

FIG. 1 a schematic diagram of a differential dual-port current conveyor circuit (DDPCC) 100. DDPCC 100 may comprise a current conveyor circuit arranged to receive a current signal at one terminal having a very low impedance value and convey the current signal to another terminal having a much higher impedance value. DDPCC 100 may be reconfigurable, and therefore may be used as a building block for various types of integrated circuit designs. For example, DDPCC 100 may be used as a modular building block to implement a wideband adjustable gain amplifier, filter, capacitance doublers potential to absolute temperature/bandgap reference circuit, and so forth. The embodiments are not limited in this context.

A first generation current conveyor circuit (CCI) may receive a current signal at one terminal at a low impedance value and convey the current signal to another terminal at a different impedance value. One input of the CCI circuit may be used as a reference terminal to receive a reference voltage and take the same current as the input current value regardless of the value of the reference voltage. The current from the reference terminal is in the same direction as the current from the input terminal. In this manner, the direction of the reference terminal current does not correspond to the polarity of the reference voltage and the reference voltage will remain regardless of the current value. An almost equal amount of current will be supplied to the output terminal at a higher impedance level than the input terminal, thereby providing a desirable current source for many applications.

A second generation current conveyor circuit (CCII) may also be a three port device whose voltage at a first port having a high impedance value controls the potential at a second port having a low or almost zero impedance level. A CCII circuit may include an ideal buffer stage having an input and an output. A current is conveyed to the buffer stage output where a current, having an equal value, is supplied to an output port of the CCII circuit having a high impedance value. Current flows from the second port to an output port having a high or infinite impedance level.

As described above, CCI and CCII may be unsatisfactory for a number of reasons. In a CCI the reference port supports a current equal to the current conveyed between the input and output ports of the circuit. In a CCII the reference port has a high impedance value which is arranged to control the potential at a second port while supporting a small or ideally zero current. Consequently, there may be a need for a current conveyor circuit that receives a current signal at one terminal having a very low impedance value and convey the current signal to another terminal having a much higher impedance value. Moreover, there may be a need for such a current conveyor circuit to provide a dual port configuration capable of more flexible circuit designs as well as capability for use in more circuit functions than previously found with such circuits. DDPCC 100 may be arranged to solve these and other problems.

Referring again to FIG. 1, DDPCC 100 includes, for example, eight (8) bipolar junction transistors (BJT) Q1–Q8 biased at the same current value. The BJTs Q1–Q8 shown in FIG. 1 may comprise, for example, NPN transistors which function as current-controlled current regulators. In other words, they restrict the amount of current that can go through each transistor according to a base current. The main or collector current that is controlled goes from emitter to collector and the base current controls the collector current which goes from emitter to base. If there is a base current, then the transistor turns on and allows a proportional amount of current through the collector.

In one embodiment, DDPCC 100 includes voltage inputs Y+ and Y−, a first set of voltage outputs X1− and X1+, a second set of voltage outputs X2− and X2+, a first set of current outputs Z1− and Z1+, and a second set of current outputs Z2− and Z2+. The base terminal of transistors Q1 and Q2 are operatively responsive to the voltage input at terminal Y+. The current output terminal Z1+ receives the collector current of transistor Q1 and the current output terminal Z2− receives the collector current of transistor Q2. The collector terminal of transistor Q5 and the base terminal of transistor Q7 are operatively responsive to the current from the emitter terminal of transistor Q1. The base terminal of transistor Q7 is coupled to the base terminal of transistor Q8 to provide the biasing current from the emitter terminal of transistor Q1 for transistors Q7 and Q8. The collector terminal of transistor Q7 is coupled to the emitter terminal of transistor Q2 where the emitter current of transistor Q2 is essentially the sum of the collector current of transistor Q7 and the base current of transistor Q2. The emitter terminal of transistor Q7 supplies the base current $I_B$ and is connected to the voltage output terminal X2+. Similarly, the emitter terminal of transistor Q8 supplies the base current $I_B$ and is connected to the voltage output terminal X1+.

In one embodiment, the base terminal of transistors Q3 and Q4 are operatively responsive to the voltage input at terminal Y−. The collector terminal of transistor Q3 supplies its collector current to current output terminal Z2+ and the collector terminal of transistor Q4 supplies its collector current to current output terminal Z1−. The emitter terminal of transistor Q3 is coupled to the collector terminal of transistor Q6 and the emitter terminal of transistor Q4 is coupled to the base terminal of transistor Q6 to provide a biasing current to transistor Q6. The base terminal of transistor Q6 is coupled to the base terminal of transistor Q5. The emitter terminal of transistor Q5 supplies the base current $I_B$ and is connected to the voltage output terminal X1−. Similarly, the emitter terminal of transistor Q6 supplies the base current $I_B$ and is connected to the voltage output terminal X2−.

Figure 2:
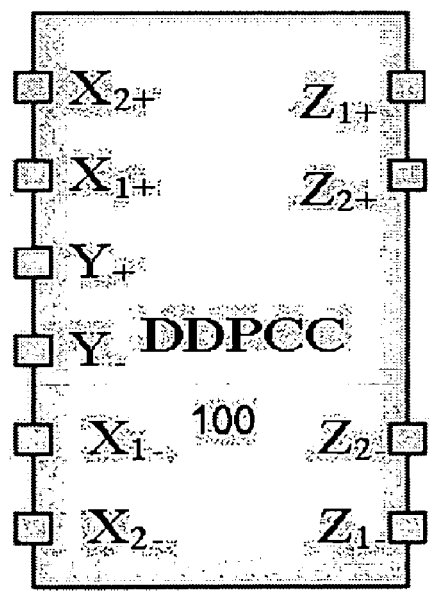
FIG. 2 illustrates a pin-out block diagram of a dual port current conveyor in accordance with one embodiment.

FIG. 2 illustrates a pin-out block diagram of a dual port current conveyor in accordance with one embodiment. FIG. 2 illustrates a pin-out diagram of the schematic representation of DDPCC 100, which includes voltage input pins Y+ and Y−, a first set of voltage output pins X1− and X1+, a second set of voltage output pins X2− and X2+, a first set of current output pins Z1− and Z1+, and a second set of current output pins Z2− and Z2+. The current and voltage values of DDPCC 100 may be represented as follows:

$I_{Y+} \sim 0$ $I_{Y+} \sim 0$ $V_{X1+-VX1-} = V_{Y+-VY-}$ $V_{X2+-VX2-} = V_{Y+-VY-}$ $I_{Z1+-IZ1-} = I_{X1+-IX1-}$ $I_{Z2+-IZ2-} = I_{X2+-IX2-}$ As stated above, the current values at voltage inputs Y+ and Y− are essentially zero (0). The voltage value at terminal X1+ minus the voltage at terminal X1− is equal to the voltage at terminal Y+ minus the voltage at terminal Y−. The voltage value at terminal X2+ minus the voltage at terminal X2− is equal to the voltage at terminal Y+ minus the voltage at terminal Y−. The current at terminal Z1+ minus the current at terminal Z1− is equal to the current at terminal X1+ minus the current at terminal X1−. The current at terminal Z2+ minus the current at terminal Z2− is equal to the current at terminal X2+ minus the current at terminal X2−.

In operation, the voltage inputs to terminals Y+ and Y− produce the same or mirror voltage outputs from the first voltage outputs X1+ and X1− and the second set of voltage outputs X2+ and X2−. The current outputs from first set of voltage outputs X1+ and X1− and second set of voltage outputs X2+ and X2− produce the same (mirror) current outputs for first set of current outputs Z1+ and Z1− and second set of current outputs Z2+ and Z2−.

Figure 3:
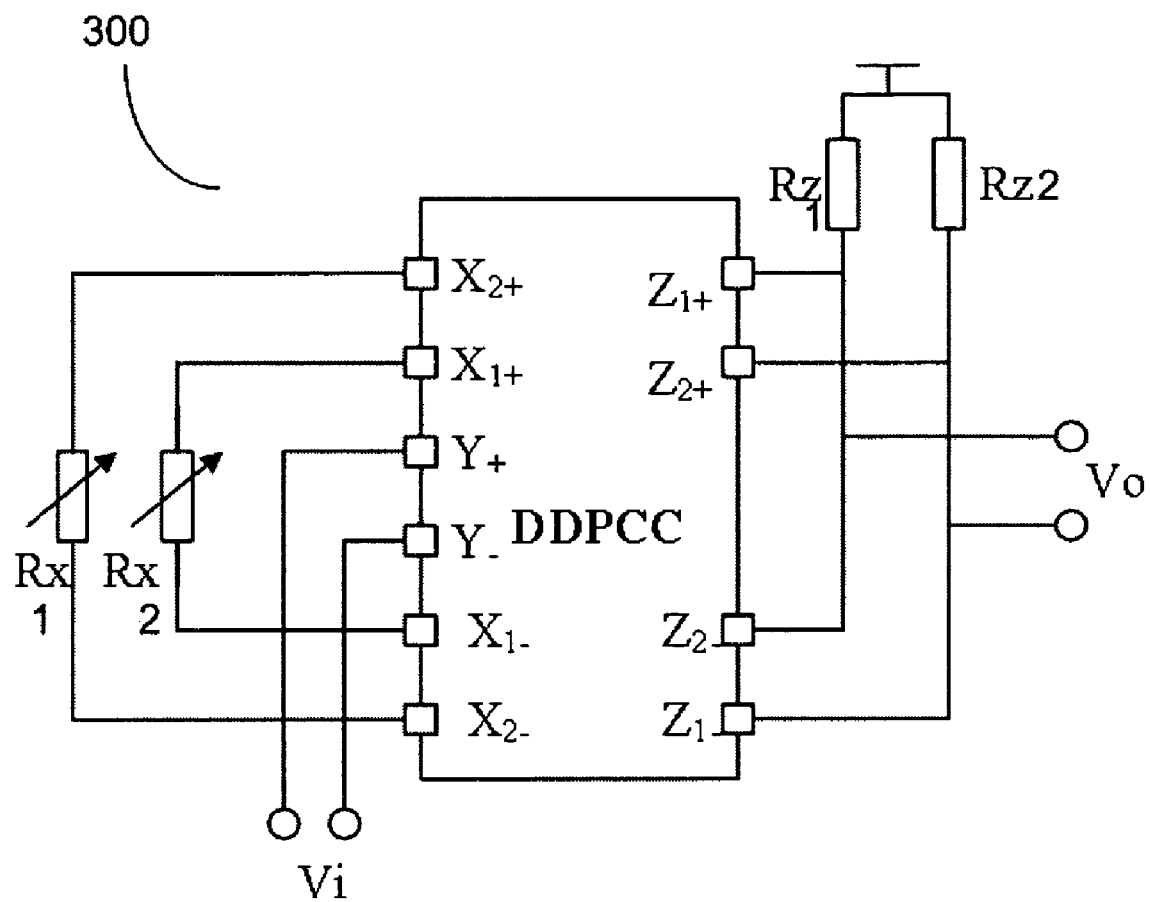
FIG. 3 illustrates a block diagram of a dual port current conveyor arranged as an amplifier in accordance with one embodiment.

FIG. 3 illustrates a block diagram of a dual port current conveyor arranged as an amplifier in accordance with one embodiment. In one embodiment, a DDPCC such as DDPCC 100 may be employed in an amplifier design useful, for example, in wide bandwidth applications. FIG. 3 illustrates a schematic diagram of a DDPCC circuit 300 arranged as an amplifier with adjustable gain. Terminals Y+ and Y− receive input voltage Vi. Resistor Rx1 is operatively coupled between first set of voltage output terminals X1+ and X1−. Resistor Rx2 is operatively coupled between second set of voltage output terminals X2+ and X2−. Resistors Rx1 and Rx2 operate as a current divider where, for example, divided current from X1− and X1+ is output from Z1− and Z1+.

Resistor Rz1 is operatively coupled between current output terminals Z1+ and Z2−. Resistor Rz2 is operatively coupled between current output terminals Z2+ and Z1−. Voltage inputs at voltage terminals Y+ and Y−=voltage outputs at voltage output terminals X1− and X1+. Resistors Rz1 and Rz2 operate to convert current back to voltage. The voltage gain at terminals Vo is proportional to input voltage Vi where Gain=4Rz/Rx. In the present arrangement, the amplifier may be very wideband and linear with fair noise figure (NF) based on resistors and bias selection.

Figure 4:
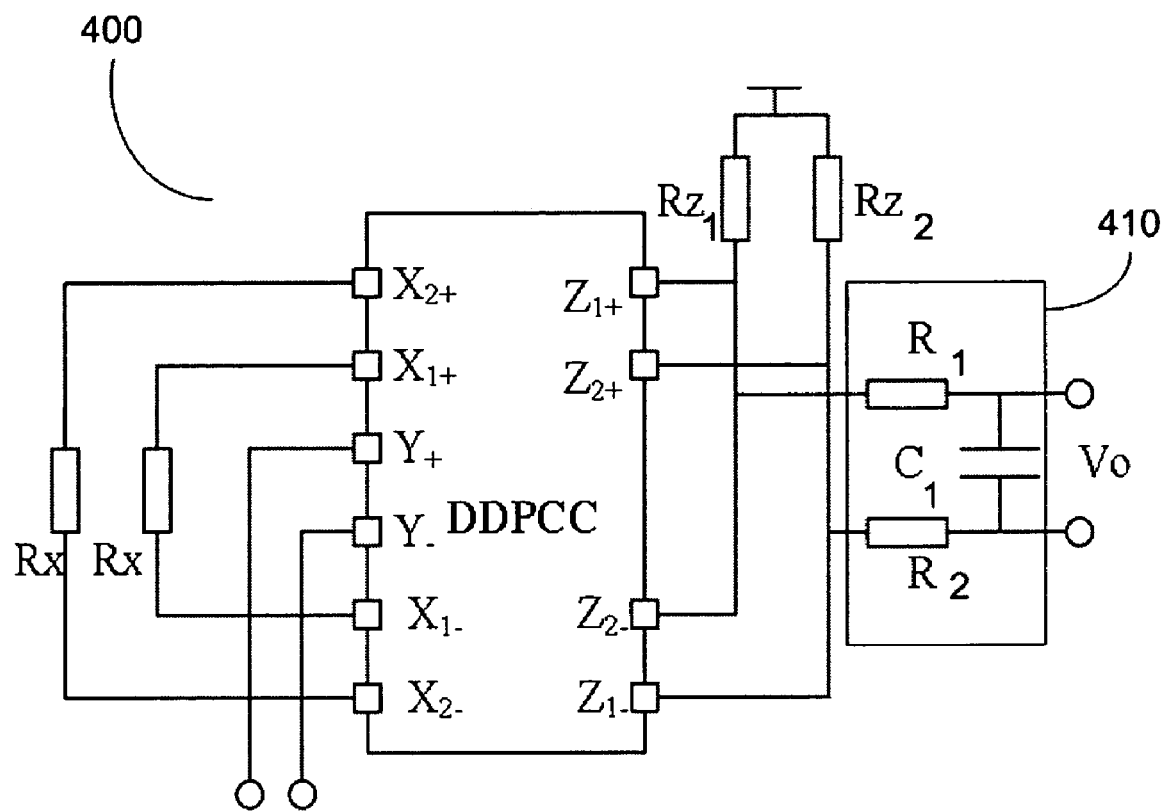
FIG. 4 illustrates a schematic diagram of a differential dual port current conveyor circuit arranged as a filter in accordance with one embodiment.

FIG. 4 illustrates a schematic diagram of a differential dual port current conveyor circuit arranged as a filter in accordance with one embodiment. In one embodiment, a DDPCC such as DDPCC 100 may be employed in a filter design useful, for example, in wide bandwidth applications. FIG. 4 illustrates a schematic diagram of a DDPCC circuit 400 arranged as a filter. Circuit 400 may be similar in configuration as the amplifier circuit shown with reference to FIG. 3, with the addition of RCR network 410 which includes resistors R1 and R2 and capacitor C1. Resistor R1 may be operatively coupled to current outputs Z1+ and Z2− and resistor Rz1. Resistor R2 may be operatively coupled to current outputs Z2+ and Z1− and resistor Rz2. Capacitor C1 may be operatively coupled between resistors R1 and R2 of network 410 and across output voltage terminals Vo. In this manner, RCR network 410 operates as a filter for voltage output Vo of circuit 400. The filter transfer function is expressed as $H(s)=(4Rz/Rx)/(1+2C(Rz+R)s))$ where R is the equivalent resistance value of resistors R1 and R2.

In one embodiment, a DDPCC may be employed in a proportional to absolute temperature (PTAT)/Bandgap Reference Circuit. The bandgap voltage reference design is widely employed in integrated circuits. The bandgap voltage usually provides an output voltage close to the theoretical bandgap of Silicon at 0K. The voltage difference between two diodes, often operated at the same current and of different junction areas, is used to generate a current PTAT in a first resistor. This current is used to generate a voltage in a second resistor. This voltage in turn is added to the voltage of one of the diodes. The voltage of a diode operated at constant current, or here with a PTAT current, is negative, with approximately −2 mV/K. If the ratio between the first and second resistor is chosen properly, the first order effects of temperature dependency of the voltage across a forward-biased diode and the voltage across the resistor with PTAT current will cancel out. The resulting voltage summary is close to the theoretical bandgap of silicon at 0 K.

Figure 5:
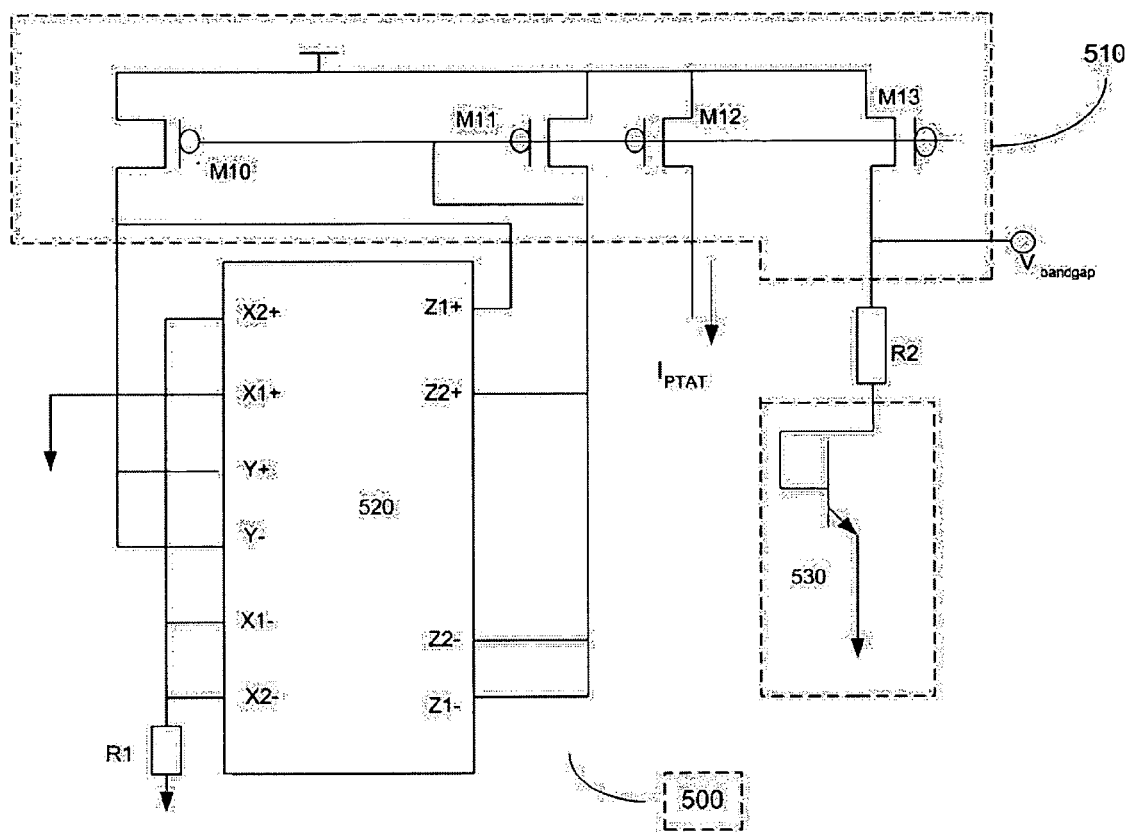
FIG. 5 illustrates a schematic diagram of an equivalent circuit for a differential dual port current conveyor circuit in accordance with practicing one embodiment.

FIG. 5 illustrates a schematic diagram of an equivalent circuit for a differential dual port current conveyor circuit in accordance with practicing one embodiment. More particularly, FIG. 5 illustrates a schematic diagram of a DDPCC such as DDPCC 100 arranged as a PTAT and bandgap voltage reference circuit 500. A conventional current mirror circuit, shown as equivalent circuit 510, may be operatively coupled to DDPCC circuit 520. A second differential dual port current conveyor, shown as equivalent circuit 520 with transistor Q' having a base terminal coupled to the collector terminal, is also coupled to current mirror circuit 510. Current output terminal Z1+ is operatively coupled to voltage input terminals Y+ and Y− and first transistor M10 of equivalent current mirror circuit 510. Transistor M11 is coupled to transistor M10 and current output terminals Z2+, Z2− and Z1− of DDPCC 520. Transistor M12 is coupled to transistor M11 and supplies potential to absolute temperature current $I_{PTAP}$. Transistor M13 is operatively coupled to transistor M12 and supplies band gap reference voltage $V_{bandgap}$. Resistor R2 is connection to equivalent DDPCC circuit 530. In this manner, DDPCC circuits 520 and 530 are coupled to a current mirror circuit to provide both a PTAT and band gap reference voltage circuit.

Figure 6:
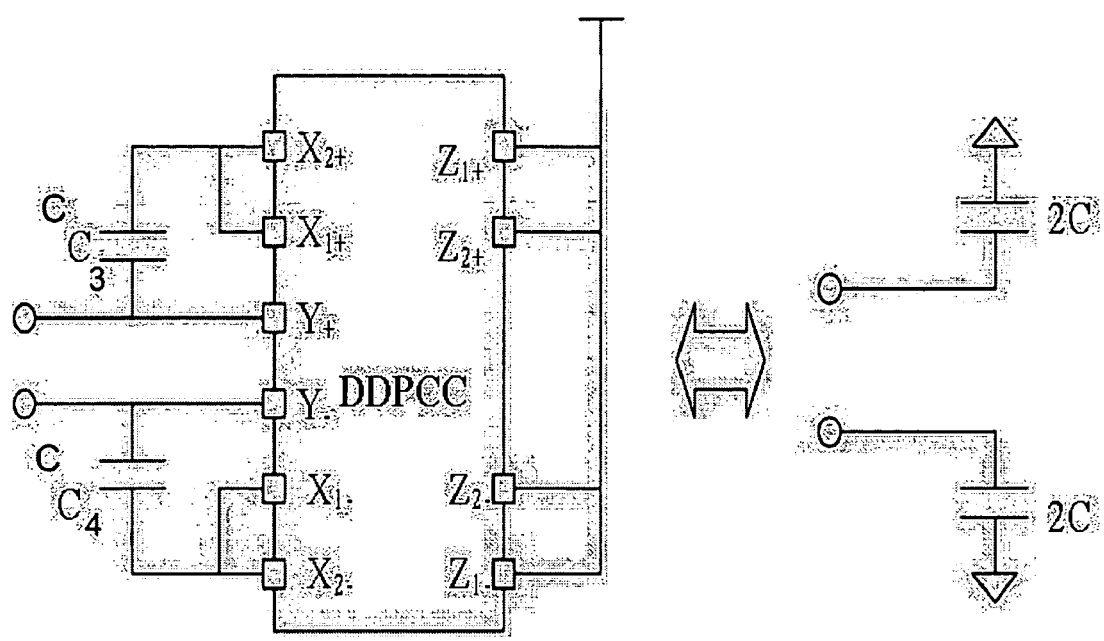
FIG. 6 illustrates a schematic diagram of a differential dual port current conveyor circuit arranged as a Miller Capacitance doubler circuit in accordance with practicing one embodiment.

FIG. 6 illustrates a schematic diagram of a differential dual port current conveyor circuit arranged as a Miller Capacitance doubler circuit in accordance with practicing one embodiment. In one embodiment, a DDPCC such as DDPCC 100 may be employed in a Miller Capacitance doubler design. FIG. 6 illustrates a schematic diagram of a DDPCC circuit arranged as a Miller Capacitance doubler circuit 600. This arrangement is useful in RF/Analog integrated circuit design due to the footprint restrictions of conventional capacitance. Capacitor C1 is operatively coupled to voltage outputs X2+ and X1+ as well as voltage input Y+. Capacitor C2 is operatively coupled to voltage outputs X1− and X2− and voltage input Y−. The Miller effect states that the simultaneous switching of both terminals of a capacitor will modify the effective capacitance between the terminals. The Miller effect compensation technique may be used in operational amplifiers to facilitate stability by using capacitance devices coupled in a feedback path between a feedback compensation node arranged within the operational amplifier and an output or in this arrangement of FIG. 6 an input of an operational amplifier. In this manner, the effective capacitance in the arrangement of FIG. 6 is doubled thereby providing implementation area reduction for circuit designers.

It is worthy to note that any reference in the specification to "one embodiment" or "an embodiment" means that a particular feature, structure, or characteristic described in connection with the embodiment is included in at least one embodiment. The appearances of the phrase "in one embodiment" in various places in the specification are not necessarily all referring to the same embodiment.

Numerous specific details may be set forth herein to provide a thorough understanding of the embodiments. It will be understood by those skilled in the art, however, that the embodiments may be practiced without these specific details. In other instances, well-known methods, procedures, components and circuits have not been described in detail so as not to obscure the embodiments. It can be appreciated that the specific structural and functional details disclosed herein may be representative and do not necessarily limit the scope of the embodiment.

While certain features of the embodiments have been illustrated as described herein, many modifications, substitutions, changes and equivalents will now occur to those skilled in the art. It is, therefore, to be understood that the appended claims are intended to cover all such modifications and changes as fall within the true spirit of the embodiments.

The invention claimed is:

1. A current conveyor circuit, comprising:
a first low impedance input to receive a first input control signal;
an output having a high impedance to supply an output current signal proportional to said first input control signal;
a first transistor having an input to receive said first input control signal and having a first differential output to supply a first differential current signal to said first differential output;
a second low impedance input to receive a second input control signal, said control signal having an opposite sign with respect to said first input control signal;
a second transistor having an input to receive said second input control signal and having a second differential output to supply a second differential current signal to said second differential output, said second differential current signal having an opposite sign with respect to said first differential current signal;
a third transistor having an input operatively coupled to said first transistor input and an output to supply a third differential current signal;
a fourth transistor having an input operatively coupled to said first transistor input and an output to supply a fourth differential current signal;
a fifth transistor having an input operatively coupled to said fourth transistor and an output to supply a first differential voltage signal;
a sixth transistor having an input operative coupled to said fifth transistor input and an output to supply a second differential voltage signal;
a seventh transistor having an input operatively coupled to said first transistor and an output to supply a third differential voltage signal; and
an eighth transistor having an input operatively coupled to said input of said seventh transistor and an output to supply a fourth differential voltage signal.

2. The current conveyor circuit of claim 1, wherein said third and fourth output current signals have the same magnitude but opposite sign for said first and second input control signals.

3. The current conveyor circuit of claim 1, wherein said first, second, third, fourth, fifth, sixth, seventh and eighth transistors are identical bipolar junction transistors, each of said transistors biased with the same current.

4. The current conveyor circuit of claim 1, further comprising a first resistor operatively coupled between said output of said sixth transistor and said output of said eighth transistor.

5. The current conveyor circuit of claim 4, further comprising a second resistor operatively coupled between said output of said fifth transistor and said output of said seventh transistor.

6. The current conveyor circuit of claim 5, further comprising a third resistor operatively coupled with said output of said first transistor and said output of said third transistor.

7. The current conveyor circuit of claim 6, further comprising a fourth resistor operatively coupled with said output of said second transistor and said output of said fourth transistor.

8. The current conveyor circuit of claim 7, wherein said first and second resistors are arranged to function as a current divider for said circuit.

9. The current conveyor circuit of claim 8, wherein said third and fourth resistors are arranged to convert current signals outputted by said first, second, third and fourth transistors to corresponding voltage signals.

10. The current conveyor circuit of claim 7, further comprising a resistor/capacitor network, said network comprising a first resistor operatively connected to said outputs of said first and second transistors, a second resistor operatively coupled to said outputs of said third and fourth transistors, and a capacitor operatively coupled between said first and second resistors of said network, said network supplying an output voltage signal.

11. The current conveyor circuit of claim 10, wherein said circuit is arranged as a filter associated with an output voltage of said circuit.

12. The current conveyor circuit of claim 1, further comprising a first capacitor operatively coupled to said outputs of said seventh and eighth transistors and said control signal supplied to said input of said first transistor.

13. The current conveyor circuit of claim 12, further comprising a second capacitor operatively coupled to said outputs of said fifth and sixth transistors and said control signal supplied to said control input of said third transistor.

14. The current conveyor circuit of claim 13, wherein said outputs of said first, second, third and fourth transistors arranged to supply first, second, third and fourth differential current signals are operatively connected.

15. A system, comprising: a first and second low impedance inputs for receiving first and second input, control signals;
  a first, second, third and fourth high impedance outputs to supply output current signals proportional to said input control signals, said first high impedance output supplying an output current signal opposite in sign with respect to said output current signal supplied by said second high impedance output, said third high impedance output supplying an output current signal opposite in sign with respect to said output current signal supplied by said fourth high impedance output;
  a first, second, third and fourth voltage output terminals to supply output voltage signals; a first and second resistors, said first resistor operatively coupled with said first and second voltage output terminals, said second resistor operatively coupled between third and fourth voltage output terminals; and
  a third and fourth resistors, said third resistor operatively coupled with said output of said first and fourth current outputs, said fourth resistor operatively coupled with said second and third current outputs.

16. The system of claim 15, wherein said third and fourth resistors are arranged to function as a current divider for said current conveyor system.

17. The system of claim 15, wherein said first and second resistors are arranged to convert current signals outputted by said to first, second, third and fourth voltage output terminals.

18. A system, comprising:
  a first low impedance input to receive a first input control signal;
  an output having a high impedance to supply an output current signal proportional to said first input control signal;
  a first transistor having an input to receive said first input control signal and having a first differential output to supply a first differential current signal to said first differential output;
  a second low impedance input to receive a second input control signal, said control signal having an opposite sign with respect to said first input control signal;
  a second transistor having an input to receive said second input control signal and having a second differential output to supply a second differential current signal to said second differential output, said second differential current signal having an opposite sign with respect to said first differential current signal; and
  a first output voltage terminal and a second output voltage terminal, with said first and second output voltage terminals coupled to a first resistor.

19. The system of claim 18, wherein said current conveyor circuit comprises a first current conveyor circuit, said first current conveyor circuit further comprising a second current conveyor circuit, with said first and second current conveyor circuits operatively coupled to a current mirror circuit.

20. The system of claim 19, wherein said current mirror circuit further comprises a first transistor communicating to said first voltage output and said first current output, a second transistor coupled to said second current output and to said first transistor a third transistor operatively coupled in parallel to said first and second transistors, said third transistor supplying a current signal associated with a potential to absolute temperature value, a fourth transistor operatively coupled to said third transistor and a second resistor, said fourth transistor supplying a voltage band gap signal output.

21. A current conveyor circuit, comprising:
  a high impedance input to receive a first input control signal;
  an output having a high impedance to supply an output current signal proportional to said first input control signal;
  a first transistor having an input to receive said first input control signal and having a first differential output to supply a first differential current signal to said first differential output;
  a low impedance input to receive a second input control signal, said control signal having an opposite sign with respect to said first input control signal;
  a second transistor having an input to receive said second input control signal and having a second differential output to supply a second differential current signal to said second differential output, said second differential current signal having an opposite sign with respect to said first differential current signal;
  a third transistor having an input operatively coupled to said first transistor input and an output to supply a third differential current signal;
  a fourth transistor having an input operatively coupled to said first transistor input and an output to supply a fourth differential current signal;
  a fifth transistor having an input operatively coupled to said fourth transistor and an output to supply first differential voltage signal;
  a sixth transistor having an input operative coupled to said fifth transistor input and an output to supply a second differential voltage signal;
  a seventh transistor having an input operatively coupled to said first transistor and an output to supply a third differential voltage signal; and
  an eighth transistor having an input operatively coupled to said input of said seventh transistor and an output to supply a fourth differential voltage signal.

22. The current conveyor circuit of claim 21, wherein said third and fourth output current signals have the same magnitude but opposite sign for said first and second input control signals.

* * * * *

UNITED STATES PATENT AND TRADEMARK OFFICE
CERTIFICATE OF CORRECTION

PATENT NO. : 7,183,851 B2 Page 1 of 1
APPLICATION NO. : 10/883358
DATED : February 27, 2007
INVENTOR(S) : Song It is certified that error appears in the above-identified patent and that said Letters Patent is hereby corrected as shown below:

In column 8, line 44, in Claim 21, after "supply" insert -- a --.

Signed and Sealed this

Sixteenth Day of October, 2007

JON W. DUDAS
*Director of the United States Patent and Trademark Office*